United States Patent [19]
Imondi et al.

[11] Patent Number: 5,319,604
[45] Date of Patent: Jun. 7, 1994

[54] CIRCUITRY AND METHOD FOR SELECTIVELY SWITCHING NEGATIVE VOLTAGES IN CMOS INTEGRATED CIRCUITS

[75] Inventors: Giuliano Imondi; Giulio Marotta; Giulio Porrovecchio; Giuseppe Savarese, all of Rieti, Italy

[73] Assignee: Texas Instruments Incorporated, Dallas, Tex.

[21] Appl. No.: 697,172

[22] Filed: May 8, 1991

[30] Foreign Application Priority Data

May 8, 1990 [IT] Italy ................................ 47927 A90

[51] Int. Cl.[5] ........................ G11C 8/00; G11C 7/00
[52] U.S. Cl. ........................ 365/230.06; 365/900; 365/189.11; 307/475; 307/578
[58] Field of Search ............ 365/230.06, 218, 189.11, 365/900; 307/242, 475, 578, 482, 270, 264

[56] References Cited

U.S. PATENT DOCUMENTS

| 4,633,106 | 12/1986 | Backes et al. ............ 307/578 |
| 4,667,312 | 5/1987 | Doung et al. ............ 365/189.11 |
| 4,720,816 | 1/1988 | Matsuoka et al. ............ 365/230.06 |
| 4,742,492 | 5/1988 | Smayling et al. ............ 365/218 |
| 4,804,637 | 2/1989 | Smayling et al. ............ 365/185 |
| 4,823,318 | 4/1989 | D'Arrigo et al. ............ 365/189 |
| 4,967,100 | 10/1990 | Okutsu et al. ............ 307/242 |

Primary Examiner—Timothy P. Callahan
Attorney, Agent, or Firm—Thomas G. Eschweiler; James C. Kesterson; Richard Donaldson

[57] ABSTRACT

Circuitry and a method are provided for selectively switching a negative voltage ($-V_{nn}$) to portions of CMOS integrated circuits, which circuitry comprises a switching/decoding matrix. The switching/decoding matrix comprises a control and decode logic (CDL) which controls signal VPPENABLE to control a positive charge pump (PCP) producing positive voltage ($+V_{pp}$) and which further controls signal VNNENABLE to control a negative charge pump (NCP) producing said negative voltage ($-V_{nn}$). The switching/decoding matrix further comprises, for each line to be switched, a switching module which comprises a PMOS transistor (PS) having its source connected to said line and its drain connected to receive said negative voltage ($-V_{nn}$) produced by said negative charge pump (NCP). The PMOS transistor (PS) gate is driven by a drive circuit being in turn driven by said control and decode logic (CDL) and connected so as to receive the positive voltage ($+V_{pp}$) provided by said positive charge pump (PCP).

17 Claims, 3 Drawing Sheets

5,319,604

CIRCUITRY AND METHOD FOR SELECTIVELY SWITCHING NEGATIVE VOLTAGES IN CMOS INTEGRATED CIRCUITS

TECHNICAL FIELD OF THE INVENTION

This invention relates in general to electronic circuits, and more particularly to a circuit and method for selectively switching negative voltages in CMOS technology integrated circuits.

BACKGROUND OF THE INVENTION

As is well known, in several integrated circuit configurations, it is desirable to utilize voltages which are negative with respect to the ground GND of the circuit. Such voltages are produced on the chip by means of so-called charge pumps. A typical example of such applications is that of the DRAM memories and of the Flash EEPROM memories.

If it were possible to switch such negative voltages, the performance of these circuits, and in particular of Flash EEPROM memories, would be noticeably improved. In N-well CMOS technology, the N-channel devices cannot be used to this end because they are incorporated in the P-type substrate of the integrated circuit and therefore their source/drain terminals cannot be exposed to negative voltages, so as not to forward bias P-N junctions, which would cause the breakdown of the negative voltage generator (charge pump).

There are many circumstances in which the integrated circuit applications in CMOS technology would be noticeably improved, if it were possible to selectively switch a negative voltage.

For instance, a Flash EEPROM memory, which is normally erased as a whole by means of a negative voltage produced at the interior of the chip, could be operated as a standard EEPROM memory, if it were possible to selectively apply the negative voltage to a single row or to a single word of the memory. Another example could be given by the implementation of a multiple state logic, in particular a tristate logic +1, 0, −1 in which the logic state −1 would be associated with a negative voltage.

The present CMOS technologies are in most cases based upon N-channel devices which are incorporated on a common P-type substrate (coinciding with the base material of the integrated circuit and connected to the ground GND), while P-channel devices are fabricated inside purposely diffused N-type regions (N-wells). Consequently, P-type devices may rely upon independent substrates, while this possibility does not exist for N-channel devices.

A locally generated, positive voltage $V_{pp}$, higher than voltage $V_{cc}$, may be easily switched selectively by using a decoding network made up of N-channel transistors and of P-channel transistors, where the substrates of the P-channel devices are biased to $V_{pp}$. In theory, it should also be possible to selectively switch a locally produced negative voltage $-V_{nn}$ lower than the ground voltage GND, but in practice this is not feasible, because of the impracticality of connecting the substrates of the N-channel transistors to the voltage $-V_{nn}$.

Clearly, the problem is not that of producing a voltage lower than the ground voltage GND on the chip by means of charge pumping techniques using only P-channel transistors and capacitors. However, in CMOS technology, present day solutions do not selectively route the negative voltage to the various portions at the interior of the chip.

Therefore, it may be seen that a need has arisen in the industry for a method and apparatus for selectively switching a negative voltage $(-V_{nn})$ to portions of CMOS integrated circuits.

SUMMARY OF THE INVENTION

A method and circuit is provided for selectively switching a negative voltage to selected ones of a plurality of nodes.

A negative voltage source supplies a negative voltage. Switching elements are coupled between said negative voltage and respective of said nodes, said switching elements being operable to conduct said negative voltage to said respective nodes responsive to a control voltage having a greater negative magnitude than said negative voltage. A positive voltage source supplies a positive voltage having a greater magnitude than said negative voltage. Drive circuits associated with each node generate a negative control voltage approximately equal in magnitude to said positive voltage responsive to a control signal. Control circuitry generates control signals to said drive circuits associated with the selected nodes to generate said negative control voltage.

BRIEF DESCRIPTION OF THE DRAWINGS

Further details and advantages of the present invention will become apparent by the following disclosure with reference to the accompanying drawings in which some prior art's solutions and the preferred embodiments of the present invention are shown, as a matter of illustration and not of limitation.

In the drawings:

FIG. 3b shows the detail of the level shifter circuits incorporated in the drive modules of the circuit of FIG. 3a;

DETAILED DESCRIPTION OF THE INVENTION

In view of the great advantages that might derive from the availability of an efficient technique for switching a negative voltage, various possibilities have been heretofore explored.

Figure 1:
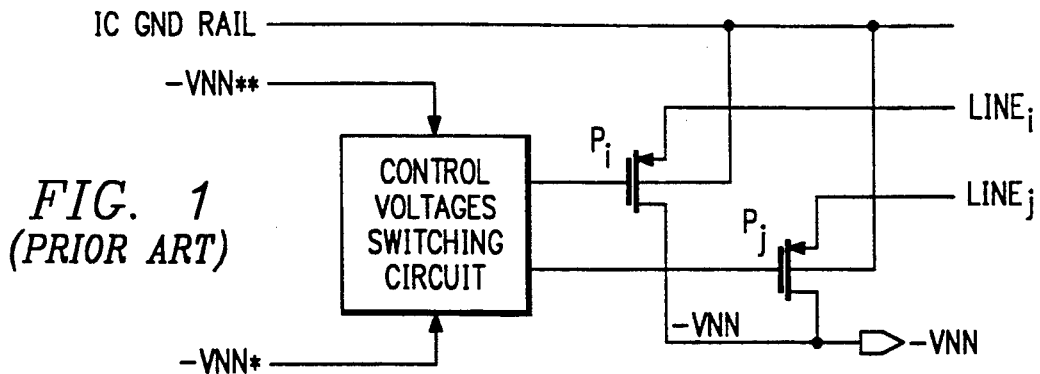
FIG. 1 shows a decode scheme according to the prior art, which scheme consists of P-channel transistors only.

First, a decoding scheme consisting only of N-channel transistors is represented in FIG. 1, in which the magnitudes of the voltages is expressed by the relationship $$|-V_{nn}^{\cdot\cdot}|>|-V_{nn}^{\cdot\cdot}|>|-V_{nn}|.$$

A shortcoming of this solution is that it does not avoid the problem of switching a negative voltage. Indeed, the negative voltage $-V_{nn}^{\cdot\cdot}$ which controls the switching P-channel transistor ($P_i$ or $P_j$) also must in turn be switched by means of an even more negative voltage $-V_{nn}^*$ and so forth.

Second, shortcomings exist where CMOS Twin-Well technology is combined with a dielectric isolation (analogously to a silicon-on-insulator CMOS process) to make the substrates of any P-channel or N-channel device separately biasable, in order to overcome the problem of forward biasing the P-N junction. In this case, a shortcoming is the very high processing cost, which is not compatible with the widespread consumption nature of the involved devices.

Figure 2:
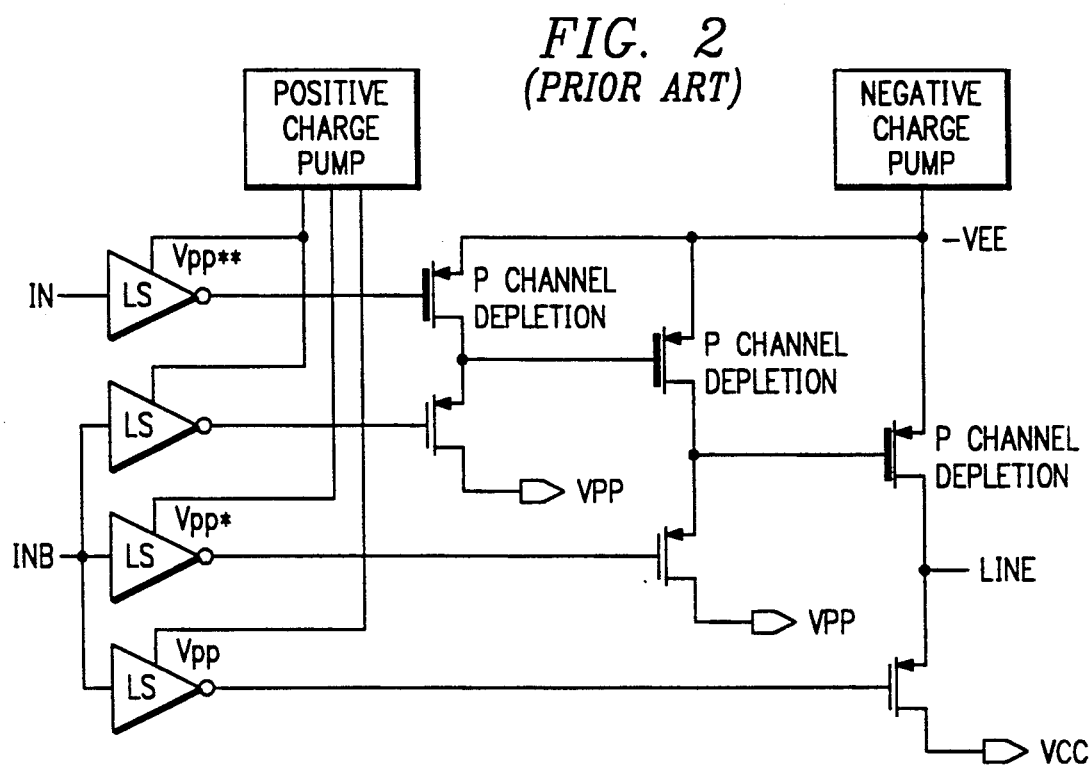
FIG. 2 shows another decode scheme according to the prior art, in which P-channel depletion transistors are employed.

Third, use of a purposely implemented P-channel depletion transistor is depicted in FIG. 2, in which the magnitudes of the voltages is expressed by the relationships:

$$V_{pp}^* > V_{pp}' + VT$$

$$V_{pp}' > V_{pp} + VT$$

$$V_{pp} > V_{cc} + VT$$

where VT represents the threshold voltage of the transistors. A detailed embodiment of the level shifter (LS) circuits is given in FIG. 3b. A primary shortcoming of this solution is that the circuit is finite and is not able to iterate to infinity when $V_{pp}'$ is reached. A further shortcoming of this solution is the addition of non-standard process steps in present CMOS technology and of a significant amount of control circuitry overhead.

Fourth, use of multiple (one for each row or for each word of the memory) negative charge pumps, selectively activated by means of conventional logic signals, has a shortcoming of proliferating the charge pumps with a consequent excessive consumption of silicon area.

In the frame of the present invention, a novel decoding scheme has been conceived and will be disclosed, which is based upon the bootstrapping technique and upon the use of P-channel transistors only. Such a novel solution, by virtue of its efficiency in terms of silicon area occupation, opens the way to a large mass of new characteristics and applications.

The present invention overcomes the drawbacks of the solutions carried out or hypothesized in the past and of providing a circuit solution which is able to switch a locally produced negative voltage to any section of a CMOS integrated circuit, without modifying the process.

Such an object is achieved by making use of the well-known bootstrapping effect by means of a capacitor inserted between the output of a level shifter or adapter circuit and the node between the source and the drain of a pair of transistors which are driven so as to insulate the capacitor by controlling such a node.

In the preferred embodiment, in detail, the object is achieved by means of circuitry and a method for selectively switching a negative voltage $(-V_{nn})$ to N portions of CMOS integrated circuits, which circuitry comprises a switching/decoding matrix 100. The switching/decoding matrix 100 comprises a control and decode logic (CDL) 102 which controls signal VPPENABLE to control a positive charge pump (PCP) 104 producing positive voltage $(+V_{pp})$ and which further controls signal VNNENABLE to control a negative charge pump (NCP) 106 producing said negative voltage $(-V_{nn})$. The switching/decoding matrix 100 further comprises, for each line to be switched, a switching module 108 which comprises a PMOS transistor (PS) having its source connected to said line and its drain connected to receive said negative voltage $(-V_{nn})$ produced by said negative charge pump (NCP) 106. The PMOS transistor (PS) gate is driven by a drive circuit being in turn driven by said control and decode logic (CDL) 102 and connected so as to receive the positive voltage $(+V_{pp})$ provided by said positive charge pump (PCP) 104.

Figure 3B:
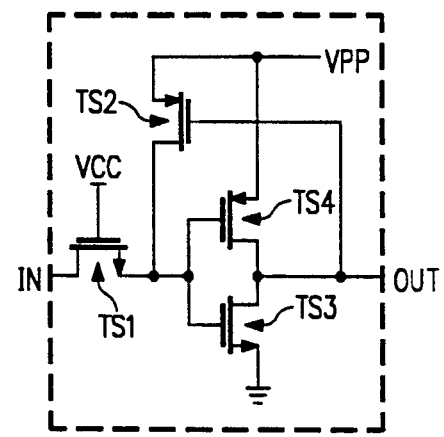
Figure 3A:
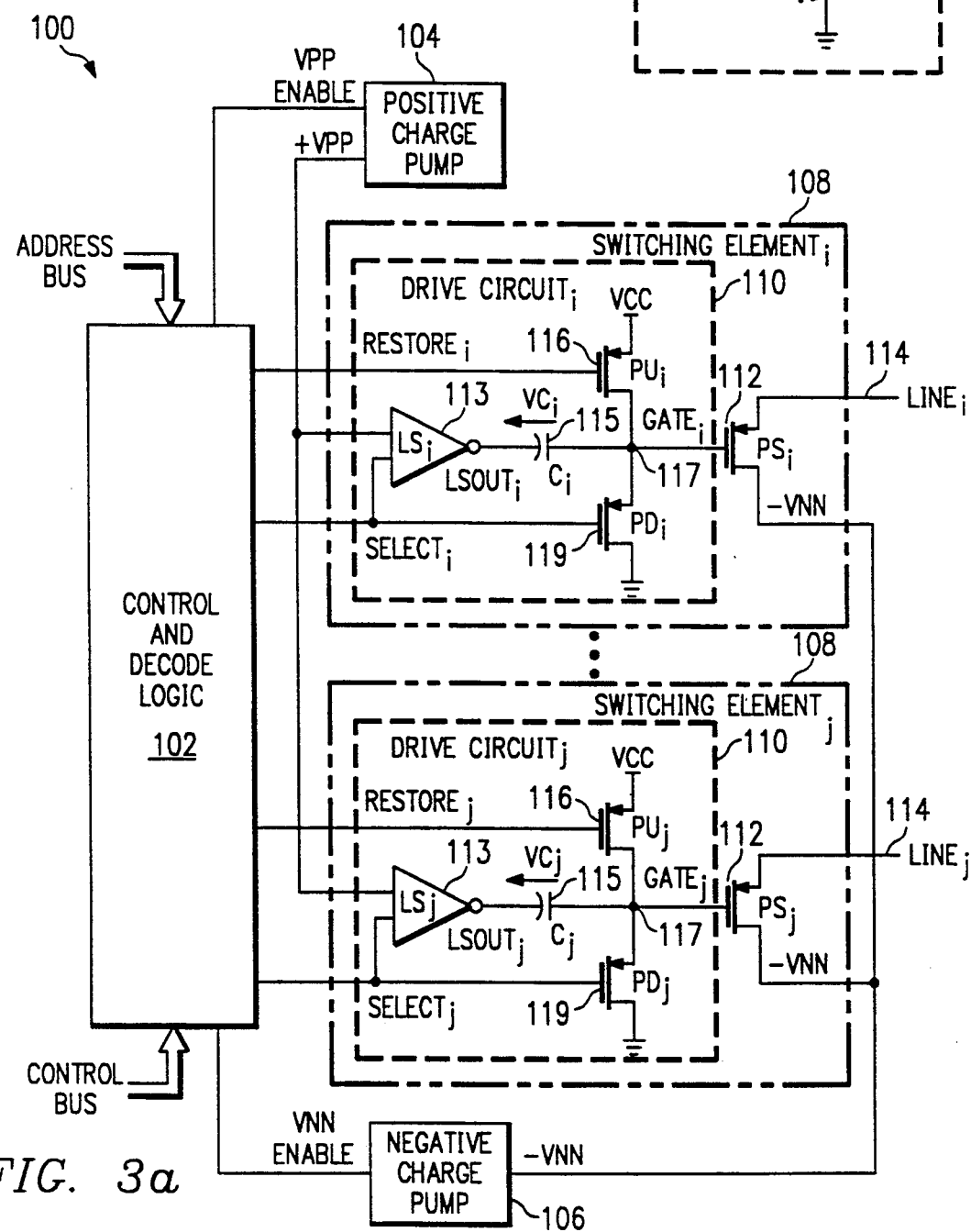
FIG. 3a shows a switching/decoding matrix for negative voltages according to the present invention.

Referring to FIG. 3a in the preferred embodiment, said bootstrapping effect driving circuit (drive circuit$_i$) comprises a capacitor (C$_i$) having a terminal connected to the output of a level shifter or adapter circuit (LS$_i$) and another terminal connected to the node of interconnection between the drain of a first PMOS transistor (PU$_i$) and the source of a second PMOS transistor (PD$_i$), said transistor PU$_i$ having its source connected to the supply voltage (V$_{cc}$) and said transistor PD$_i$ having its drain connected to ground (GND), and each being driven on the gate directly by said control and decode logic (CDL) (signal RESTORE$_i$ coupled to the gate of transistor PU$_i$, and signal SELECT$_i$ coupled to the gate of transistor PD$_i$).

Figure 5:
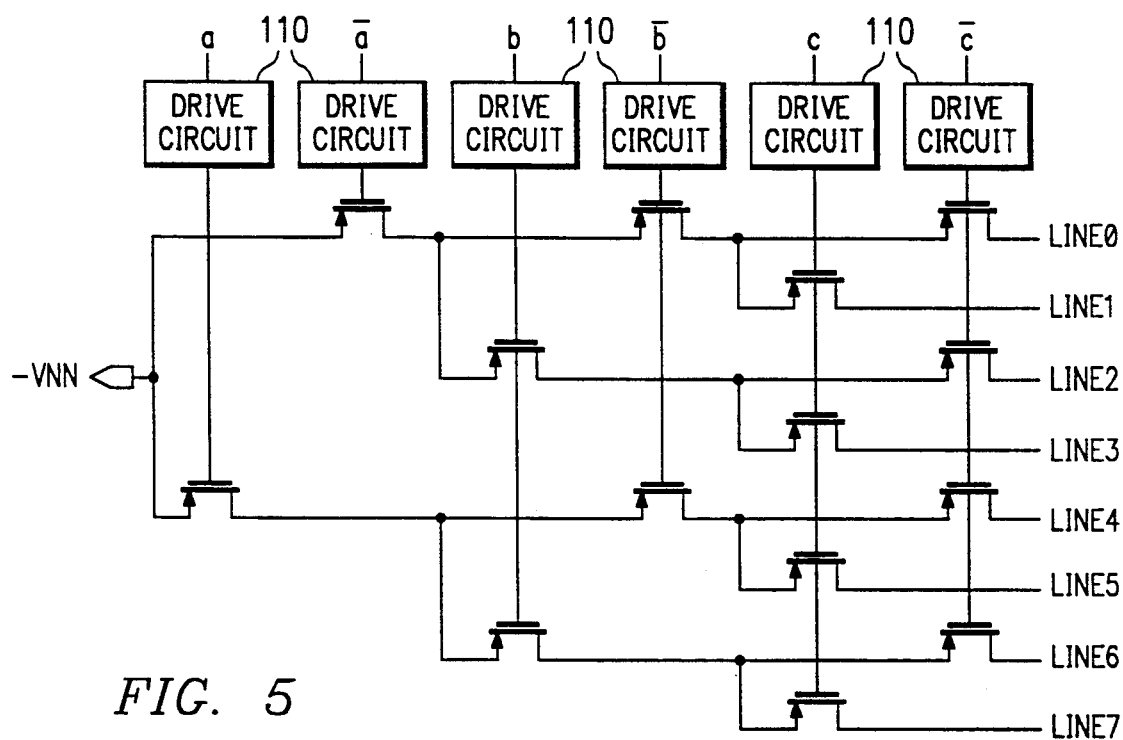
FIG. 5 shows a tree decoder structure in the case of eight lines.

In an alternative embodiment shown in FIG. 5, the decode matrix comprises 2·N drive circuits to drive a tree configuration of PMOS transistors, in order to switch the negative voltage to $2^N$ lines.

FIG. 3a shows a theoretical scheme of a switching/decoding matrix for negative voltages according to the present invention. This embodiment is specifically related to an EEPROM circuitry, but the idea is absolutely novel and may be applied to any other application.

The suggested embodiment comprises the following blocks or main modules:

A. a charge pump PCP 104 which produces a positive voltage $V_{pp}$ greater than $V_{cc}$;

B. a charge pump NCP 106 which produces a negative voltage $-V_{nn}$ lower than the ground voltage GND;

C. a control and decode logic CDL 102;

D. an ordered set or mosaic of switching modules or elements 108, one for each line of the integrated circuit, particularly for each memory row, to which the negative voltage $-V_{nn}$ is to be selectively applied.

Figure 4:
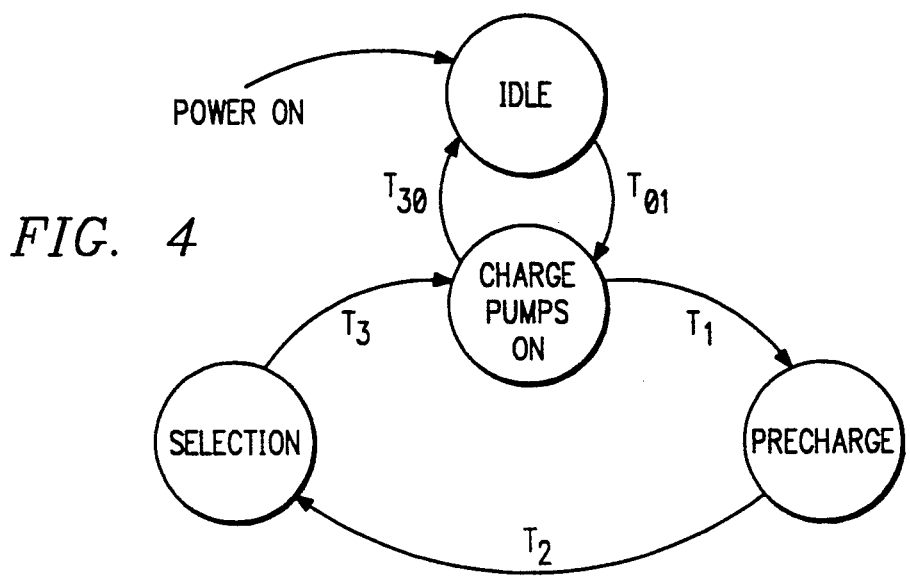
FIG. 4 shows a flow diagram which indicates the transitions between the various states which the switching/decoding matrix can assume.

The overall operation of the circuit is described by the flow diagram of FIG. 4. Before explaining the operation, however, the circuit's structure will be illustrated with reference to FIGS. 3a and 3b.

With reference to FIG. 3a, it is seen first that a switching module 108 including a drive circuit 110 are provided for each of the n lines, n being equal to 1, ... , i, j, ... , N, to which the negative voltage is to be distributed. For the sake of simplicity of illustration, naturally, the circuit has been limited to two lines i and j. As is seen, each of the switching elements 108 comprises a drive circuit 110 which drives a DMOS transistor PS 112 having its source connected to LINE 114 which reaches the memory row or word that must be, for instance, cleared. The drain of each transistor PS 112 is connected to receive the voltage $-V_{nn}$ from the negative charge pump 106.

Each drive circuit 110 comprises in turn a level shifter circuit (LS$_n$) 113 which receives a respective selection signal SELECT from the control and decode logic 102, receives the positive voltage $+V_{pp}$ from the positive charge pump (PCP) 104 and has its output coupled to the gate of the said transistor PS$_n$ of the switching element 108 through a capacitor ($C_n$) 115 and a node 117 (labelled $GATE_n$). Moreover, the drive circuit 110 comprises two cascaded PMOS transistors ($PD_n$) 119 and ($PU_n$) 116, with the drain of transistor ($PD_n$) 119 being connected to the ground (GND), and the source of transistor $PU_n$ 116 being connected to the supply voltage ($V_{cc}$). Transistor $PD_n$ 119 is driven on its gate directly by the control and decode logic (CDL) 102 by means of the above-mentioned selection signal $SELECT_n$, while transistor $PU_n$ 116 is driven on its gate directly by the CDL 102 by means of the resetting signal $RESTORE_n$.

With reference to FIG. 3b, the scheme of a level shifter circuit (LS) 113 is shown comprising four CMOS transistors connected as represented. Specifically, the drain of a first transistor TS1 forms the input to the circuit, the gate of TS1 is connected to the voltage $V_{cc}$, and the source of TS1 is connected to the drain of a second transistor TS2. TS2 has its source connected to the positive voltage $V_{pp}$ from the positive charge pump PCP. The source of TS1 is also connected to the gates of transistors TS3 and TS4. The source of TS3 is connected to the ground potential GND, and the source of TS4 is connected to the positive voltage $V_{pp}$ of said positive charge pump PCP. The output of the circuit is provided by the drains connected to each other of transistors TS3 and TS4 and is connected also to the gate of transistor TS2.

The operation of the circuit is described with reference to FIGS. 3a, 3b and 4.

Upon powering on, the circuit is set into a state of settlement (IDLE) through the transition T0 as shown in FIG. 4.

In the IDLE state, the following conditions take place (in the discussion which follows, $n=0, 1, \ldots, i, j, \ldots, N$):

the signals VPPENABLE and VNNENABLE as shown in FIG. 3a, i.e. the enable signals provided by the control and decode logic 102 to enable the charge pumps PCP 104 and NCP 106, are both OFF, so that both pumps are inactive, that is to say: $V_{pp}=V_{cc}$ and $-V_{nn}=GND$;

the signals $SELECT_n$ that the control and decode logic 102 applies to the N drive circuits are $SELECT_n=V_{cc}$, so that the output signals of the level shifter circuits $LS_n$ 113, i.e. $LSOUT_n=GND$ and the transistors $PD_n$ 119 are turned off;

the signals $RESTORE_n$ that are applied by the control and decode logic 102 to the same N drive circuits are $RESTORE_n=GND$, so that the transistors $PU_n$ 116 conduct and the signal on the node $GATE_n$ is equal to $V_{cc}$.

As a consequence, in the IDLE state, all transistors are turned off, and the voltages $VC_n$ across capacitors$_n$ are equal to $-V_{cc}$ (with reference to the nodes $GATE_n$).

When the negative voltage $-V_{nn}$ must be switched to $LINE_i$ of the N lines, the transition T01 sets the circuit into the next state "CHARGE PUMPS ON", and then the transition T1 sets the circuit into the precharge state.

In such a situation, the following conditions hold:

the signals VPPENABLE and VNNENABLE are both high, so that both charge pumps PCP and NCP are ON or active. In other words, $V_{pp}=+18$ volts and $-V_{nn}=-11$ volts, both values being typical.

As a consequence of this, the ON state of the charge pumps PCP and NCP coincides with all transistors $PS_n$ being cut off and the voltages $VC_n$ across capacitors $C_n$ being equal to $-V_{cc}$ (with reference to nodes $GATE_n$, as shown by the arrow across $C_n$). In the Switching Element$_n$, no change occurs during the transition from state "IDLE" to state "CHARGE PUMPS ON".

In the transition T1 from the state "CHARGE PUMPS ON" to the state "PRECHARGE", the following conditions take place:

the signal $RESTORE_i$ that the control and decode logic 102 applies to the gate of the transistor $PU_i$ pertinent to $LINE_i$ becomes equal to $V_{cc}$, so that transistor $PU_i$ becomes non-conducting or turned off.

the signals $RESTORE_n$ (being $n \neq i$) that the control and decode logic 102 applies to the gates of the transistors $PU_n$ pertinent to the other lines are equal to GND, so that such remaining transistors $PU_n$ are still in conduction;

the signal $SELECT_i$ that the control and decode logic applies to the level shifter circuit $LS_i$ and to the gate of the transistor $PD_i$ again pertinent to the $LINE_i$ is equal to GND, so that the transistor $PD_i$ conducts;

the signals $SELECT_n$ that the control and decode logic 102 applies to the level shifter circuits $LS_n$ and to the gates of the transistors $PD_n$ of the other lines are equal to $V_{cc}$, so that such remaining transistors $PD_n$ do not conduct.

As a consequence of such conditions, in the PRE-CHARGE state, the level shifter circuit $LS_i$ brings its output node $LSOUT_i$ to $V_{pp}$ and the transistor $PD_i$ brings the node $GATE_i$ to the potential GND+VT, where VT represents the threshold voltage of the transistor $PD_i$. The voltage $VC_i$ across the capacitor $C_i$ rises from $-V_{cc}$ to $V_{pp}-VT$ (again with reference to the node $GATE_i$). The voltages $VC_n$ (where $n \neq i$) of all other capacitors $C_n$ remains unchanged, i.e. equal to $-V_{cc}$.

Once the PRECHARGE state stabilizes, the transition T2 brings the circuit into the subsequent state of "SELECTION".

In the transition T2, the signal $SELECT_i$ becomes equal to $V_{cc}$. Consequently, the output signal $LSOUT_i$ of the level shifter circuit $LS_i$ of the $LINE_i$ moves from $V_{pp}$ to GND. At the same time, transistor $PD_i$ becomes non-conductive, leaving the node $GATE_i$ floating, so that the capacitor $C_i$ no longer has a discharge path (neglecting leakages). Because the voltage $VC_i = V_{pp} - VT$ across the capacitor $C_i$ cannot vary suddenly, the transition $V_{pp} \rightarrow GND$ which takes place at the output of level shifter $LS_i$ on the node $LSOUT_i$ causes a corresponding transition $GND+VT \rightarrow -V_{pp}+VT$ on the node $GATE_i$ (it is assumed that $C_i >> C_{par}$, where $C_{par}$ comprises all parasitic capacitances of the node $GATE_i$, which for the most part are due to the gate capacitance of the transistor $PS_i$). Hence, the transistor $PS_i$ only is selectively switched into conduction, leaving transistors $PS_n$ (where $n \neq i$) of all other lines in the non-conductive state, as desired.

In this manner, the well-known bootstrapping effect takes place on the capacitor $C_i$ in cooperation with the level shifter circuit $LS_i$, thereby effecting changes in the voltage on one plate of capacitor $C_i$, and further in cooperation with the node $GATE_i$ which, by properly driving transistors $PU_i$ and $PD_i$, insulates another plate of capacitor $C_i$.

If it is assumed that the negative control voltage on the node $GATE_i$ (i.e. $-V_{pp}+VT$) is more negative than $-V_{nn}-VT_b$ (where $VT_b$=threshold voltage of the transistor $PS_i$ affected by the body effect), then the negative voltage $-V_{nn}$ will be wholly transferred to the $LINE_i$.

Naturally, as already mentioned, the node $GATE_i$ is subject to leakages and, therefore, it is necessary that the value of the capacitance $C_i$ is designed accordingly, such that the control voltage applied to the node $GATE_i$ is sufficiently negative to satisfy the condition $-V_{pp}+VT<-V_{nn}-VT_b$ for the desired time. For very long switching times, a suitable refreshing mechanism may be added, to avoid imparting impractical values to the capacitance $C_i$.

The transition T3 resets the circuit into the state "CHARGE PUMPS ON" to cause the circuit to leave the SELECT state and to cause the negative voltage $-V_{nn}$ to be removed from $LINE_i$.

In the transition T3, the signal $RESTORE_i$ applied by the control and decode logic 102 to the gate of the transistor $PU_i$, again in relation to $LINE_i$, becomes equal to GND.

In this manner, the whole pattern already described for the state CHARGE PUMPS ON is reset, and in particular the node $GATE_i$ is brought back to $V_{cc}$ since the transistor $PU_i$ is switched back into the state of conduction.

At this point, the sequence of transitions T1, T2, T3 already discussed may be iterated as many times as it is desired in order to switch the negative voltage $-V_{nn}$ to a different line, as for instance $LINE_j$ of the n lines. Alternatively, a further transition T30 may reset the circuit into the initial state IDLE.

In the transition T30, the control and decode logic 102 supplies charge pumps PCP 104 and NCP 106 with signals VPPENABLE and VNNENABLE which are both OFF, such that both the charge pumps PCP and NCP are OFF or inactive and such that $V_{pp}=V_{cc}$ and $-V_{nn}=GND$.

Consequently, the whole pattern already described for the state IDLE is restored to the situation where the sources of $V_{pp}$ and of $-V_{nn}$ are inactive, where all the transistors $PS_n$ (being n=1, . . ., i, j, . . ., N) are in the state of conduction, and where all the voltages $VC_n$ across the capacitors are equal to $-V_{cc}$ (again with reference to the nodes $GATE_n$).

Although in FIG. 3a, a one-to-one correspondence is assumed between the number of $LINES_n$ and Switching $Elements_n$ for the sake of convenience, it may also be convenient to adopt a tree decode configuration when the number of lines becomes very high (as in the case of memories).

FIG. 5 shows the case of eight LINES 0-7 which require six Drive Circuits a, ā, b, b̄, c, c̄. In the general case, the commutation of $2^N$ lines will require $2 \times N$ Drive Circuits. Specific applications may require a compromise solution between a tree configuration and a one-to-one configuration, with a suitable combination of the two solutions.

Moreover, it should be apparent that all the considerations set forth above are based on the hypothesis of a standard CMOS N-Well technology. However, it is apparent that the same considerations may be applied as a matter of principle to the reciprocal case of the CMOS P-Well technology, under the only condition that all devices and the polarities of all voltages are consistently inverted. Particularly, the problem in this opposite case will consist in the selective switching of a positive voltage greater than $V_{cc}$, and in overcoming the limitations due to unavailability of the substrata of transistors with a P-channel.

The preferred embodiments of the present invention have been described, but it is to be understood that those who are skilled in the art will be able to make modifications and variations without so departing from the scope of the enclosed claims.

What is claimed is:

1. Circuitry for selectively switching a negative voltage to selected ones of a plurality of nodes, comprising:
    a negative voltage source for supplying a negative voltage;
    switching elements coupled between said negative voltage and said plurality of nodes, said switching elements operable to conduct said negative voltage to selected nodes of said plurality of nodes responsive to a control voltage having a greater negative magnitude than said negative voltage;
    a positive voltage source for supplying a positive voltage having a greater magnitude than said negative voltage;
    drive circuits connected to the switching elements and the positive voltage source for generating a negative control voltage approximately equal in magnitude to said positive voltage responsive to a control signal; and
    control circuitry connected to the drive circuits, the positive voltage source, and the negative voltage source for generating control signals to said drive circuits to generate said negative control voltage.

2. The circuitry of claim 1 wherein said negative voltage source comprises a negative charge pump.

3. The circuitry of claim 2 wherein said negative charge pump is operable to selectively provide a first and second negative voltage levels responsive to a control signal from said control circuitry.

4. The circuitry of claim 1 wherein said positive voltage source comprises a positive charge pump.

5. The circuitry of claim 4 wherein said positive charge pump is operable to selectively provide a first and second positive voltage levels responsive to a control signal from said control circuitry.

6. The circuitry of claim 1 wherein said switching elements comprise MOS transistors.

7. The circuitry of claim 6 wherein said switching elements comprises PMOS transistors.

8. The circuitry of claim 1 wherein said drive circuits comprise:
    a capacitor having a first plate coupled to a respective switching element;
    isolation circuitry for selectively coupling said first plate to one or more predetermined voltages to precharge said first plate to a desired voltage and for isolating said first plate from said predetermined voltages; and
    level shift circuitry having an output coupled to the second plate of said capacitor, operable to generate a voltage transition at said output from a first voltage level to a second voltage level responsive to a control signal from said control circuitry while said first plate is isolated such that a negative control voltage is placed on said switching element.

9. The circuitry of claim 1 wherein ones of said nodes are coupled to a plurality of switching elements.

10. The circuit of claim 1 further comprising:
    a plurality of control lines connected to the plurality of nodes; and a plurality of memory cells connected to the plurality of control lines, wherein each memory cell is individually erasable by selectively conducting the negative voltage to one of the plurality of control lines.

11. The circuit of claim 1 wherein the drive circuits and switching elements form a decode matrix, the decode matrix configured such that the output states of the drive circuits form a binary code which selects the appropriate node to conduct the negative voltage such that 2*N drive circuits provide negative voltages to $2^N$ nodes thereby decreasing the number of drive circuits needed for applications having large numbers of nodes.

12. A method of selectively switching a negative voltage to one or more of a plurality of nodes comprising the steps of:
  precharging a plurality of capacitive elements to a first desired voltage;
  applying the negative voltage to switching elements, the switching elements having control terminals coupled to a first plate of the plurality of capacitive elements, said switching elements operable to conduct said negative voltage to the plurality of nodes responsive to a control voltage having a greater negative voltage magnitude than the negative voltage applied to the control terminal of the switching element;
  selecting the nodes to which the negative voltage is to be applied; and
  generating a negative voltage transition on a second plate of said capacitive elements of the selected nodes, such that the voltages at the selected control terminals are pulled to a magnitude greater than said negative voltage thus enabling the switching elements of the selected nodes and conducting the negative voltage to the selected nodes.

13. The method of claim 12 wherein said step of applying a negative voltage comprises the step of generating a negative voltage with a negative charge pump.

14. The method of claim 12 wherein said generating step comprises the step of charging said second plate with a positive voltage with respect to the first plate and reducing said voltage at said second plate such that the voltage on said first plate is reduced in response thereto.

15. The method of claim 14 wherein said charging step comprises the step of generating a positive voltage having a magnitude greater than the negative voltage.

16. The method of claim 15 wherein said step of generating the positive voltage comprises the step of generating a positive voltage using a charge pump.

17. The method of claim 12 wherein said precharging step comprises the step of selectively switching predetermined voltage levels to said first plate.

* * * * *